United States Patent
Baum

[11] Patent Number: 6,005,247
[45] Date of Patent: Dec. 21, 1999

[54] ELECTRON BEAM MICROSCOPE USING ELECTRON BEAM PATTERNS

[75] Inventor: Aaron W. Baum, San Francisco, Calif.

[73] Assignee: Intevac, Inc., Santa Clara, Calif.

[21] Appl. No.: 08/942,334

[22] Filed: Oct. 1, 1997

[51] Int. Cl.[6] .............................. G01N 23/00; H01J 37/26
[52] U.S. Cl. .......................... 250/310; 250/307; 250/357
[58] Field of Search ................................... 250/310, 397, 250/398, 492.2

[56] References Cited

U.S. PATENT DOCUMENTS

| | | | |
|---|---|---|---|
| 4,460,831 | 7/1984 | Oettinger et al. | 250/492.2 |
| 4,820,927 | 4/1989 | Langner et al. | 250/492.2 |
| 4,906,894 | 3/1990 | Miyawaki et al. | 313/542 |
| 4,970,392 | 11/1990 | Oettinger et al. | 250/423 |
| 5,039,862 | 8/1991 | Smith et al. | 250/432 |
| 5,557,105 | 9/1996 | Honjo et al. | 250/310 |
| 5,684,360 | 11/1997 | Baum et al. | 313/542 |
| 5,799,104 | 8/1998 | Nakamura et al. | 250/492.2 |

OTHER PUBLICATIONS

Semiconductor on Glass Photocathodes for High Throughput Maskless Electron Beam Lithography by Baum et al, 41st Electron Ion & Photon Beam Nanolithography Conference, 1997.

J. E. Schneider et al. Semiconductor on Glass Photocathodes as High Performance Sources for Parallel Electron Beam Lithography.

Coulomb effect in cell projection lithography, by Sohda et al. J. Vac. Sci. Technol. B, vol. 13, No. 6 Nov./Dec. 1995 pp. 2419–2423.

Recent Progress in Electron–Beam Cell Projection Technology Yamashita et al. Jpn. J. Appl. Phys. vol. 35 1996 Pt. 1 No. 12 B pp. 6404–6414.

*Primary Examiner*—Bruce C. Anderson
*Attorney, Agent, or Firm*—Stanley Z. Cole; William McClellan

[57] ABSTRACT

An electron beam microscope includes an electron beam pattern source, a vacuum enclosure, electron optics, a detector and a processor. The electron beam pattern source generates a sequence of electron beam patterns for illuminating a set of pixels on a specimen. The electron optics directs the sequence of electron beam patterns to the specimen. The detector detects a result of an interaction between each of the electron beam patterns and the specimen and produces a sequence of detector signals. The processor, in response to the sequence of detector signals, generates an image including a pixel value representative of each of the illuminated of pixels on the specimen. The electron beam microscope preferably includes a deflector for deflecting each of the electron beam patterns relative to the specimen.

28 Claims, 8 Drawing Sheets

← SCAN DIRECTION

← SCAN DIRECTION

ELECTRON BEAM MICROSCOPE USING ELECTRON BEAM PATTERNS

FIELD OF THE INVENTION

This invention relates to electron beam microscopy and, more particularly, to methods and apparatus for electron beam microscopy which employ electron beam patterns for improved performance.

BACKGROUND OF THE INVENTION

Electron beam microscopy involves generation of an electron beam, directing the electron beam at a specimen and detecting a result of the interaction of the electron beam with the specimen. The result of the interaction is typically secondary electrons and backscattered primary electrons, but may also be visible light, ultraviolet light, X-rays or the like. The electron beam source, the specimen and the detector are located within a vacuum enclosure. Traditionally, electron beam microscopy has been performed using single beam or projection techniques.

Single, or point, beam systems, such as the scanning electron microscope (SEM) are used extensively for microscopy due the relative simplicity of design and use. In point beam systems, an electron beam is focused to a small diameter, and particles emitted from the specimen are detected as a function of position to generate an image of the specimen. The diameter of the electron beam sets a lower limit on resolution. For many applications using this approach, the primary limitation on performance is space charge interaction within the beam. This causes irreversible defocusing of the beam and thus limits the current that can be delivered to the specimen for a given resolution. The deliverable current determines the speed with which the microscope can scan a given specimen with a given signal-to-noise ratio. For many applications, higher speed is desirable.

In projection techniques, areas of the specimen larger than a single pixel are exposed to a uniform flood beam of electrons, and a result of the interaction with the specimen is detected with an imaging detector to generate an image of the specimen. These techniques have the advantage of improved throughput because space charge effects are reduced but have the disadvantage of the complexities associated with the imaging optics and the imaging detectors, and have not been widely used.

The throughput advantages of pattern projection in electron beam lithography have been established in simulation and experiment. See, for example, J. E. Schneider et al, "Semiconductor on Glass Photocathodes as High-Performance Sources for Parallel Electron Beam Lithography", *J. Vac. Sci. Technol.* B, Vol. 14, No. 6, Nov./Dec. 1996, pp. 3782–3786 and A. W. Baum et al, "Semiconductor on Glass Photocathodes for High Throughput Maskless Electron Beam Lithography", 41*st Electron. Ion and Photon Beam and Nanolithography Conference,* 1997.

Accordingly, there is a need for improved methods and apparatus for electron beam microscopy, wherein high resolution and high speed are achieved simultaneously, while minimizing added complexity.

SUMMARY OF THE INVENTION

According to a first aspect of the invention, an electron beam microscope is provided. The electron beam microscope comprises an electron beam pattern source, a vacuum enclosure, electron optics, a detector and a processor. The electron beam pattern source generates a sequence of electron beam patterns for illuminating a set of pixels on a specimen. The vacuum enclosure maintains a vacuum between the electron beam pattern source and the specimen. The electron optics directs the sequence of electron beam patterns to the specimen. The detector detects a result of an interaction between each of the electron beam patterns and the specimen and produces a sequence of detector signals. The processor, in response to the sequence of detector signals, generates an image comprising a pixel value representative of each of the illuminated pixels on the specimen.

Preferably, the electron beam microscope further comprises a deflector for deflecting each of the electron beam patterns relative to the specimen. The deflector causes multiple sets of pixels on the specimen to be illuminated with the sequence of electron beam patterns. The detector produces a sequence of detector signals for each of the sets of pixels, and the processor generates an image of the illuminated sets of pixels of the specimen.

In a first scanning technique, a first set of pixels is sequentially illuminated with the electron beam patterns of a sequence. Then the electron beam patterns are deflected to a second set of pixels and the second set of pixels is sequentially illuminated with the electron beam patterns of the sequence. This process is repeated over the area of the specimen or a desired portion of the specimen. In a second scanning technique, the specimen or a desired portion of the specimen is scanned with a first electron beam pattern of a sequence. Then the microscope switches to a second electron beam pattern and the specimen or the desired portion of the specimen is scanned with the second electron beam pattern. This process is repeated for each electron beam pattern in the sequence of electron beam patterns. In each case, the detector detects the result of the interaction between each of the electron beam patterns and the specimen and produces detector signals. The detector signals are used to generate an image of the specimen or the desired portion of the specimen.

In a preferred embodiment, the electron beam pattern source comprises a negative electron affinity cathode on a light-transmissive substrate, a light source, electron optics and a source vacuum enclosure. The light source directs light beams through the light-transmissive substrate at active areas of the photocathode for exciting electrons into the conduction band of the photocathode. The electron optics forms the electrons emitted from the active areas of the photocathode into electron beams. The source vacuum enclosure maintains the photocathode at high vacuum such that electrons in the conduction band of the photocathode have higher energies than electrons in the source vacuum enclosure adjacent to the photocathode and have a high probability of emission into the source vacuum enclosure from the active areas of the photocathode. The light beams may comprise laser beams, and the light source may comprise laser diodes.

The processor may generate a pixel value representative of each of the plurality of illuminated pixels by multiplying a matrix containing the sequence of detector signals by an inverse illumination matrix representative of the sequence of electron beam patterns.

According to another aspect of the invention, a method for obtaining an image of a specimen is provided. The method comprises the steps of illuminating a set of pixels on a specimen with a sequence of electron beam patterns, detecting a result of an interaction between each of the electron beam patterns and the specimen and producing a sequence of detector signals, and generating an image comprising a pixel value representative of each of the illuminated pixels in response to the sequence of detector signals.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
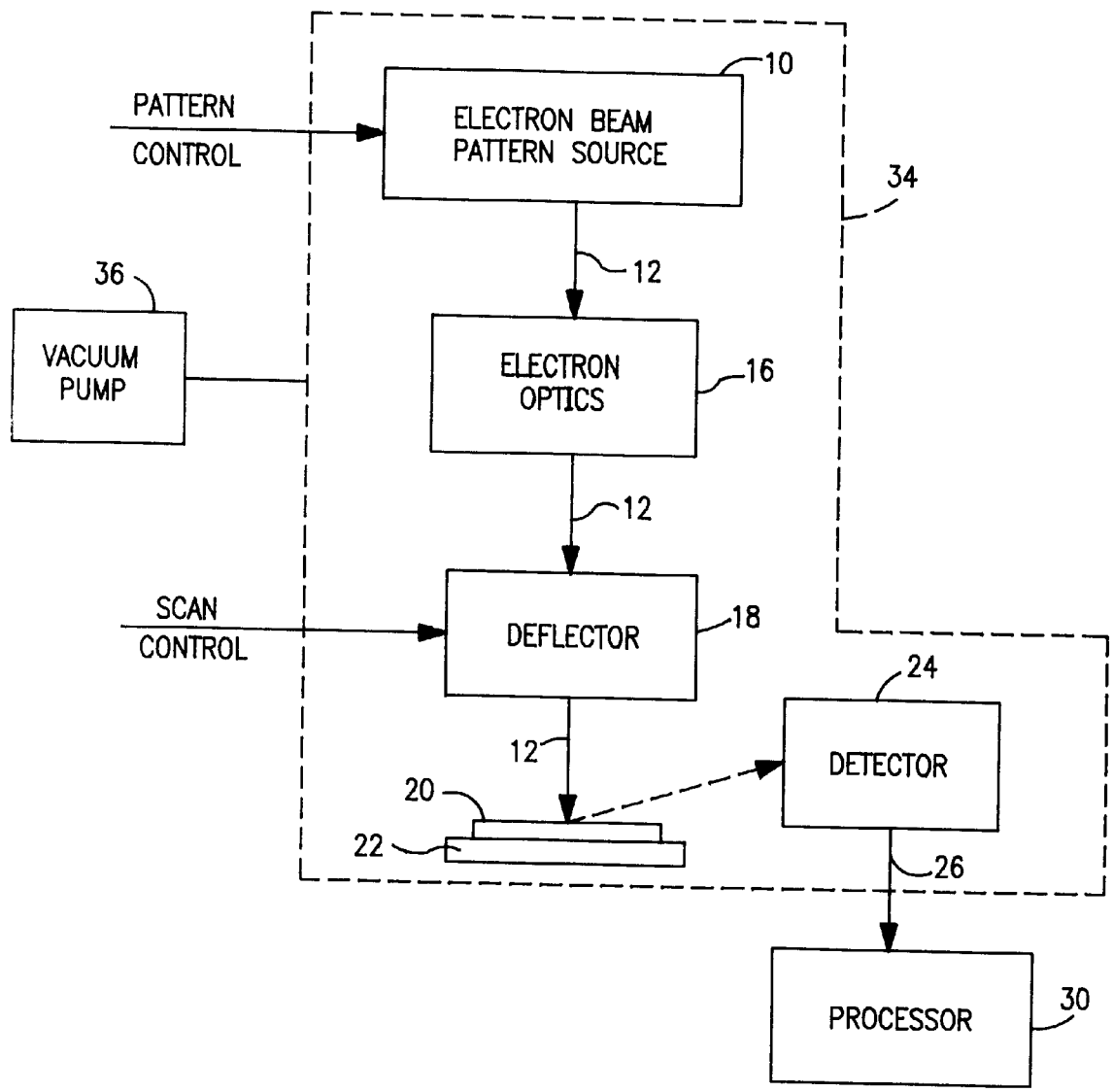
FIG. 1 is a block diagram of an electron beam microscope in accordance with an embodiment of the invention.

A block diagram of an example of an electron beam microscope in accordance with the present invention is shown in FIG. 1. An electron beam pattern source 10 generates a sequence of electron beam patterns, illustrated schematically as an electron beam pattern 12. The electron beam pattern 12, as described in detail below, comprises one or more electron beams. Each electron beam in the electron beam pattern may have any desired cross-sectional shape. However, the electron beams are typically point beams having approximately circular cross sections.

The electron beam pattern source 10 generates the sequence of electron beam patterns in response to pattern control signals. The sequence of electron beam patterns is generated by individually controlling each of the electron beams that comprise the electron beam pattern. Thus, the pattern control signals may include multiple signal lines. Each electron beam may be varied between a maximum current and zero current. In one example, binary control is utilized, and each electron beam is either on at a specified current level or is off (zero current). In another example, intermediate current levels may be utilized. The patterns of the sequence of electron beam patterns are generated sequentially in time. For each pattern, the state of each electron beam in the pattern is established by the corresponding control signal. The sequence of electron beam patterns may be repeated as necessary for obtaining an image as described below.

The electron beam pattern 12 is directed through electron optics 16 and a deflector 18 to a specimen 20 mounted on a specimen holder 22. The electron optics 16 may, for example, demagnify the electron beam pattern 12 for illumination of specimen 20. The electron optics 16 includes electron optical elements which generate electric and/or magnetic fields that focus or defocus the electron beams in the electron beam pattern. Electron optical techniques are known to those skilled in the art.

The deflector 18 deflects the electron beam pattern 12 relative to specimen 20 in response to a scan control signal. The deflector 18 deflects electron beam pattern 12 to different regions of specimen 20. The deflector 18 includes deflector elements which produce electric and/or magnetic fields that deflect electrons in the electron beam pattern 12 in response to the scan control signal. Techniques for deflection of charged particle beams are well known to those skilled in the art. Typically, electron beam pattern 12 is deflected to desired regions of the specimen, and the sequence of electron beam patterns is repeated for illumination of each region.

The electron beam pattern 12 interacts with specimen 20 and produces a result that depends on the parameters of each electron beam in electron beam pattern 12, such as energy and current, and the characteristics of the specimen 20. The interaction typically produces scattered primary electrons and secondary electrons and may, in some instances, produce visible light, ultraviolet light, X-rays or the like. The result of the interaction is detected by a detector 24 positioned in proximity to specimen 20. To reduce complexity and cost, the detector 24 is preferably a non-imaging detector and may, for example, be an electron detector of the type used in conventional scanning electron microscopes.

The detector 24 produces a detector signal 26 in response to the interaction between electron beam pattern 12 and specimen 20. Thus, for example, the detector signal 26 may result from backscattered primary electrons and secondary electrons that reach detector 24. The microscope may include one or more elements (not shown) for directing the result of the interaction between beam pattern 12 and specimen 20 to detector 24. Electric and/or magnetic fields may be used to direct charged particles from specimen 20 to detector 24. Similarly, one or more lenses may be used to direct light from specimen 20 to detector 24. As noted above, the electron beam pattern source 10 produces a sequence of electron beam patterns. Detector 24 produces a detector signal 26 in response to each electron beam pattern 12 in the sequence of electron beam patterns, so that a detector signal corresponds to each electron beam pattern. For a linear detector, the detector signal is the sum of the responses of the specimen to each electron beam in the electron beam pattern. The sequence of detector signals is supplied to a processor 30. The detector signals are typically digitized and supplied to processor 30 in digital form, but analog signals may also be used. The processor 30 analyzes the sequence of detector signals to produce an image of the region of specimen 20 illuminated by the corresponding sequence of electron beam patterns, as described in detail below.

At least a portion of electron beam pattern source 10, electron optics 16, deflector 18 and detector 24 are located within a vacuum enclosure 34. The vacuum enclosure 34 is connected through a suitable conduit to a vacuum pump 36 or a combination of vacuum pumps. All or most of the path followed by electron beam pattern 12 between source 10 and specimen 20 and all or most of the path followed by electrons between specimen 20 and detector 24 are maintained at high vacuum during operation. In some applications, a region near the specimen may be at or near atmospheric pressure. The main column may be maintained at high vacuum (approximately $10^{-6}$ to $10^{-7}$ torr), whereas the region around a negative electron affinity cathode is maintained at ultra high vacuum (approximately $10^{-9}$ torr) during operation. The main column may be separated from the region of the photocathode by a diffusion limiting aperture to maintain the required vacuum levels.

Figure 2:
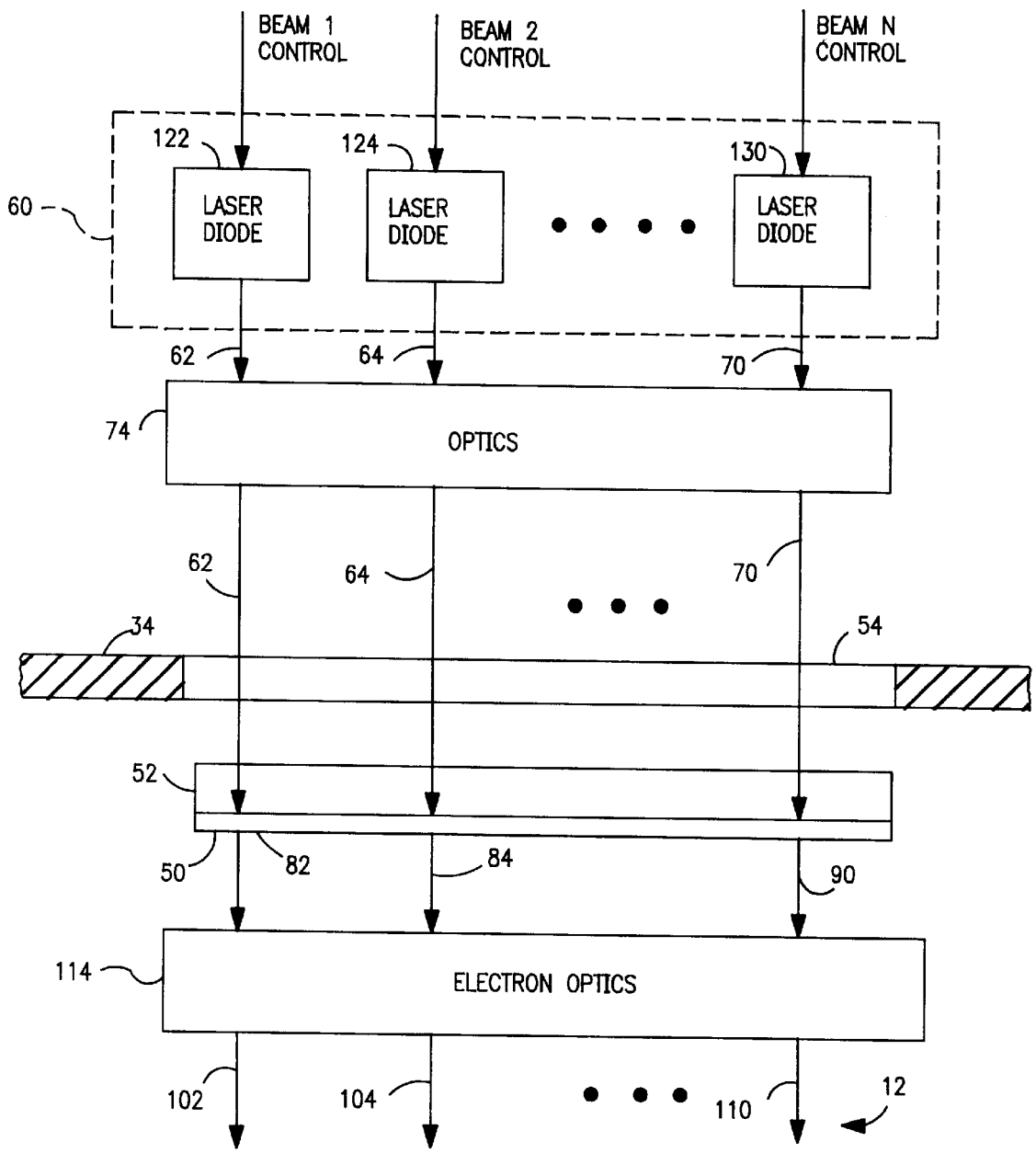
FIG. 2 is a block diagram of an example of the electron beam pattern source, including a first embodiment of a light source.

An example of an electron beam pattern source, suitable for use in the electron beam microscope of FIG. 1, is shown in FIG. 2. A photocathode 50 is located on a surface of a light-transmissive substrate 52. The photocathode 50 is located within vacuum enclosure 34 and is thus in an ultra high vacuum environment during operation. The vacuum enclosure 34 may include a vacuum window 54 for transmission of light beams to photocathode 50 as described below. In an alternative configuration, the light-transmissive substrate 52 may form part of the vacuum enclosure wall. A light source 60 directs light beams 62, 64, . . . 70 through optics 74, vacuum window 54 and substrate 52 to active areas 82, 84, . . . 90 of photocathode 50. Each of the active areas 82, 84, . . . 90 emits electrons into the vacuum region defined by vacuum enclosure 34. The electrons are formed into parallel electron beams 102, 104, . . . 110 by electron optics 114.

The photocathode 50 in the example of FIG. 2 is a negative electron affinity (NEA) photocathode. The photocathode comprises a semiconductor, usually a column III-V compound such as gallium arsenide, heavily P-doped (1–5× $10^{19}$) with a material such as zinc, magnesium or carbon so as to raise the conduction band relative to the Fermi level. The cleaned semiconductor surface is exposed to cesium and oxygen to form an activating layer a few monolayers thick. The activation layer lowers the work function so that the conduction band in the bulk is above the vacuum level, the condition of negative electron affinity. When electrons are excited from the valence band into the conduction band within a diffusion length (typically a few micrometers) of the surface, many of the electrons diffuse to the surface, where they have a high probability of escaping the surface into the vacuum.

In general, the photocathode may be any material that meets the negative electron affinity conditions specified above. The photocathode is typically a semiconductor material. Compounds of column III material, such as gallium, aluminum and indium, and column V materials such as phosphorous, arsenic and nitrogen, are typically used. Other suitable NEA materials include diamond, silicon carbide, aluminum nitride and gallium nitride. Some NEA materials may not require an activation layer. Typically, NEA photocathodes may be activated by exposure to cesium and oxygen. Alternatively, the activation layer may be formed by exposure to cesium only or to cesium and nitrogen trifluoride; other potentially low work function materials may also be used. The photocathode 50 is preferably very thin to limit lateral spreading of electrons within the photocathode. Preferred thicknesses of photocathode 50 are about one micrometer or less. Additional information regarding NEA photocathodes is described in pending application Ser. No. 081499,945, filed Jul. 10, 1995, which issued on Nov. 4, 1997 as U.S. Pat. No. 5,684,360, which is hereby incorporated by reference.

The light source 60 generates light beams 62, 64, . . . 70 of desired wavelength and intensity. Optics 74 focuses each of the light beams to a small diameter at the surface of photocathode 50. The light source 60 may have a variety of configurations and may include one or more lasers or broadband light sources. When a broadband light source is used, the light source may include a suitable optical filter to produce light of a desired wavelength or wavelength range. For photocathodes fabricated of column III-V materials, the wavelength is typically in the range of 300–800 nanometers. The selected wavelength depends on the absorption band of the photocathode material to excite electrons to the conduction band and on the thickness of the photocathode. The power level of the light source 60 is relatively low. Typically, power levels less than 10 milliwatts are required for excitation of photocathode 50. The optics 74 may incorporate correction for spherical aberration of vacuum window 54 and substrate 52.

A first embodiment of the light source 60, shown in FIG. 2, comprises laser diodes 122, 124, . . . 130 which generate light beams 62, 64, . . . 70, respectively. Each laser diode is controlled by a beam control signal which modulates the output intensity of the respective laser diode. Each beam control signal may vary the output light intensity of the respective laser diode between a maximum level and zero. The light intensities of the respective light beams 62, 64, . . . 70 in turn control the current levels of electron beams 102, 104, 110. Thus, the beam control signals control the electron beam pattern 12 and correspond to the pattern control signals shown in FIG. 1. Different combinations of the beam control signals produce different electron beam patterns.

The light beams 62, 64, . . . 70, may form any desired spatial pattern on photocathode 50, such as, for example, a linear pattern, an X–Y grid or the like. The selected pattern depends on the scanning technique utilized in the electron beam microscope. The spatial pattern of light beams on photocathode 50 defines the pattern of parallel electron beams emitted by the electron beam pattern source. Electron beam patterns are discussed in more detail below.

Figure 3:
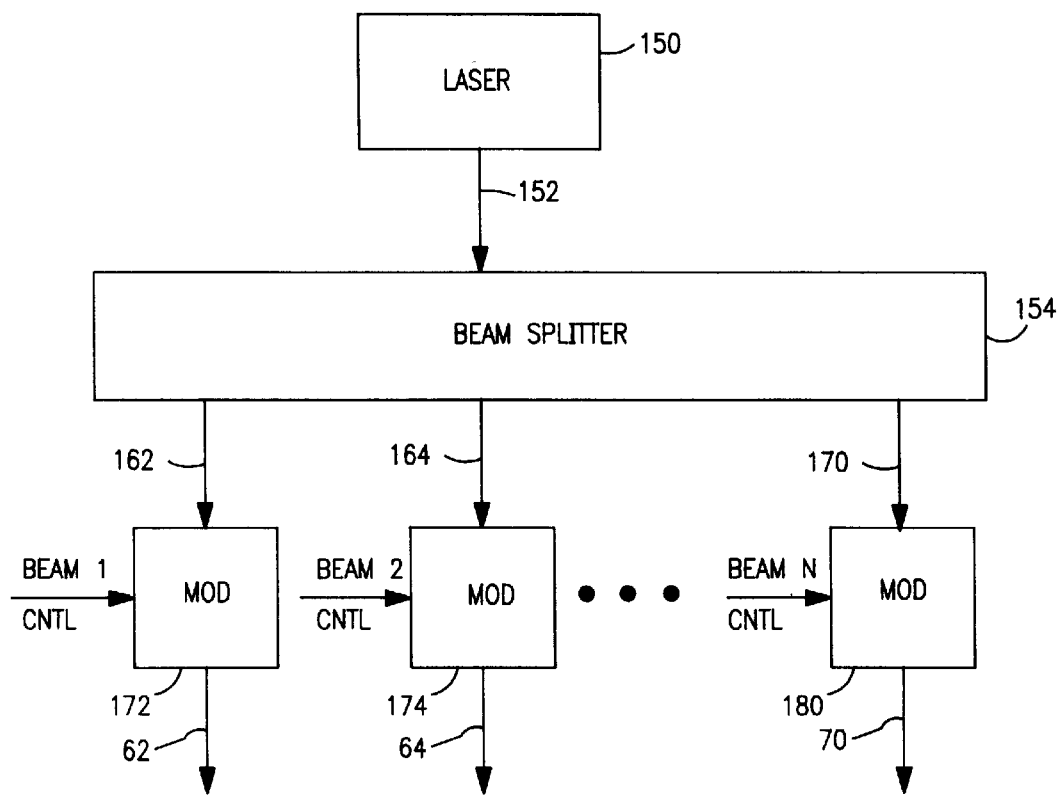
FIG. 3 is a block diagram of a second embodiment of the light source.

A block diagram of a second embodiment of the light source 60 is shown in FIG. 3. A laser 150 directs a laser beam 152 to a multiple way beamsplitter 154. The beamsplitter 154 divides laser beam 152 into beams 162, 164, . . . 170. The laser beams 162, 164, . . . 170 are supplied to optical modulators 172, 174, . . . 180, respectively. The modulators 172, 174, . . . 180 control laser beams 162, 164, . . . 170 in response to individual beam control signals and supply modulated light beams 62, 64, . . . 70 through optics 74 (FIG. 2) to photocathode 50.

Figure 4:
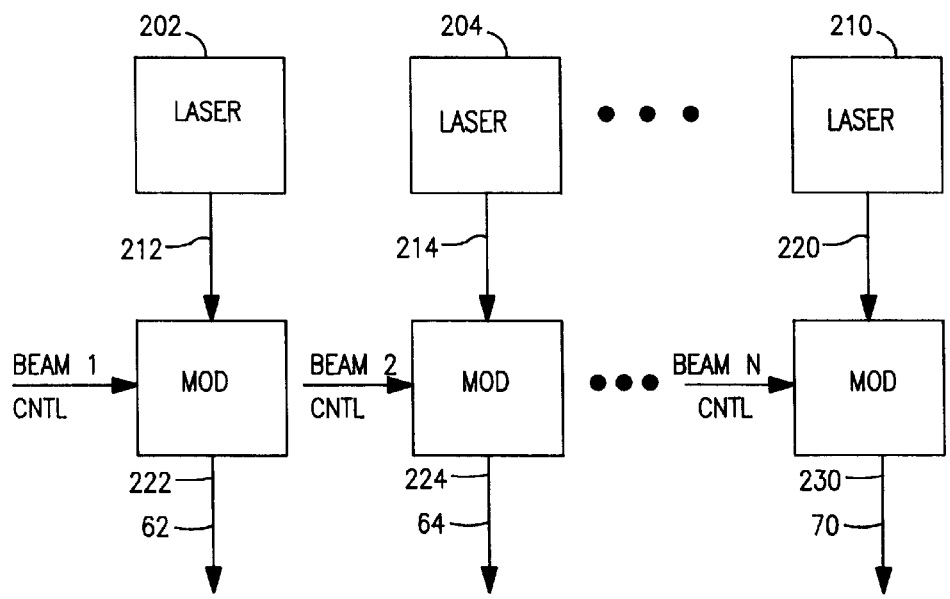
FIG. 4 is a block diagram of a third embodiment of the light source.

A block diagram of a third embodiment of the light source 60 is shown in FIG. 4. Lasers 202, 204, . . . 210 supply laser beams 212, 214, . . . 220 to optical modulators 222, 224, . . . 230, respectively. The modulators 222, 224, . . . 230 modulate laser beams 212, 214, . . . 220 in response to individual control signals and supply modulated light beams 62, 64, . . . 70 through optics 74 (FIG. 2) to photocathode 50.

Other configurations of the electron beam pattern source are included within the scope of the present invention. For example, an array of electron emitters, such as avalanche diodes or field emitter tips, may be utilized, with individual elements of the array energized electronically. Other photocathodes may be utilized within the scope of the invention. In addition, a combination of light illumination and electronic gating, wherein a photocathode is illuminated with a broad light beam and portions of the beam are electronically gated, may be utilized. Furthermore, an electron source which produces a broad electron beam may be used to illuminate a blanking aperture array. In general, the electron beam source should be capable of producing multiple electron beams which may be selectively turned on and off to form a sequence of electron beam patterns.

Figure 5:
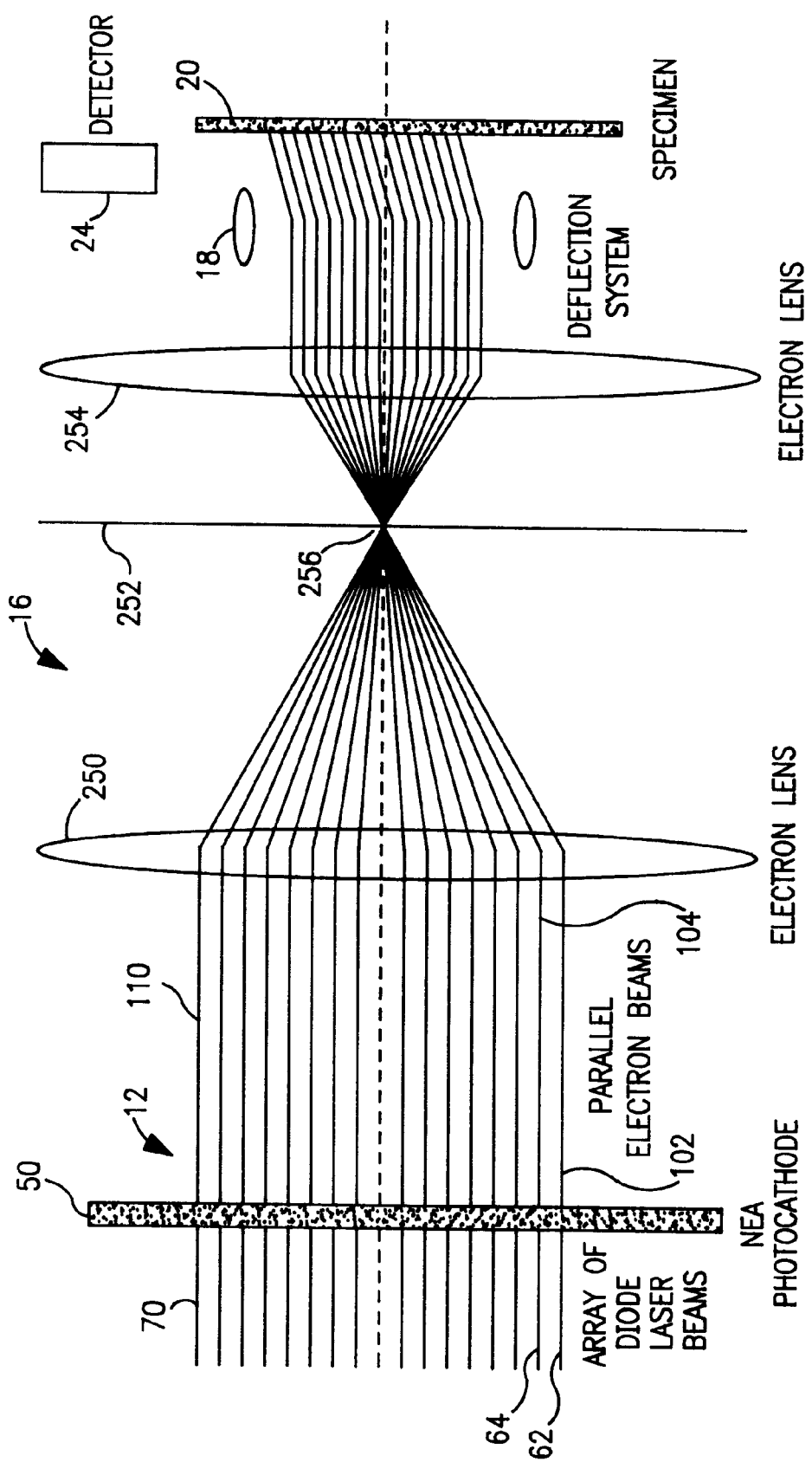
FIG. 5 is a schematic representation of the electron beam microscope of the present invention.

A schematic representation of an electron beam microscope in accordance with the invention is shown in FIG. 5. Like elements in FIGS. 1, 2 and 5 have the same reference numerals. Light beams 62, 64, . . . 70 are incident on NEA photocathode 50, producing parallel electron beams 102, 104, . . . 110. The parallel electron beams pass through electron optics 16 and deflector 18 and illuminate a region of specimen 20. In the example of FIG. 5, electron optics 16 includes an electron lens 250, a mask plate 252 and an electron lens 254. Electron lens 250 focuses electron beams 102, 104, . . . 110 on an aperture 256 in mask plate 252. Electron lens 254 directs the electron beams that pass through aperture 256 along parallel paths to specimen 20, with a resulting demagnification of the electron beam pattern. The deflector 18 deflects the electron beams in the electron pattern relative to specimen 20 so that the electron beam pattern illuminates a desired region of specimen 20. Detector 24 detects a result of the interaction of the electron beam pattern with specimen 20.

As discussed above, electron beam pattern source 10 projects a sequence of electron beam patterns onto specimen 20, and the response of the specimen to each electron beam pattern is detected by detector 24. An example of a simple sequence of electron beam patterns is shown in FIGS. 6A–6D. The beam configuration of FIGS. 6A–6D includes four electron beams 300, 302, 304 and 306 in a 2×2 array. The electron beams 300, 302, 304 and 306 are projected by electron optics 16 onto pixels 310, 312, 314 and 316 of specimen 20. It is assumed that beam 300 illuminates pixel 310, beam 302 illuminates pixel 312, beam 304 illuminates pixel 314 and beam 306 illuminates pixel 316. The pixels of specimen 20 are defined as individual areas of the specimen that correspond to pixels in an image of the specimen to be obtained by the electron beam microscope. The responses of pixels 310, 312, 314 and 316 are detected by detector 24 to produce a detector signal for each electron beam pattern.

Figure 6A:
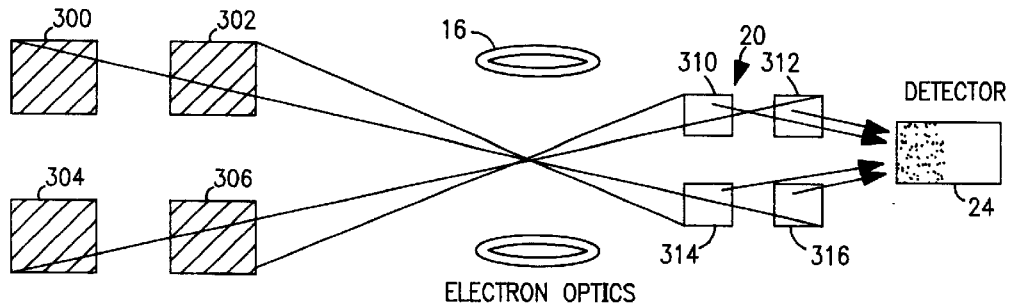
FIGS. 6A–D are schematic diagrams that illustrate the operation of the electron beam microscope of the present invention with a sequence of electron beam patterns.
Figure 6B:
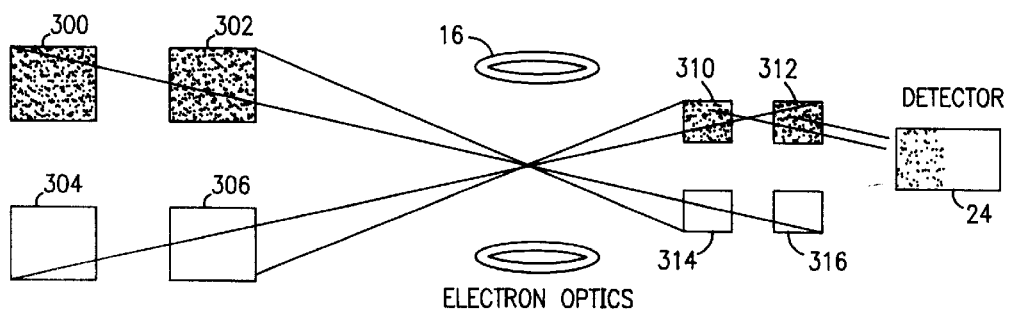
Figure 6C:
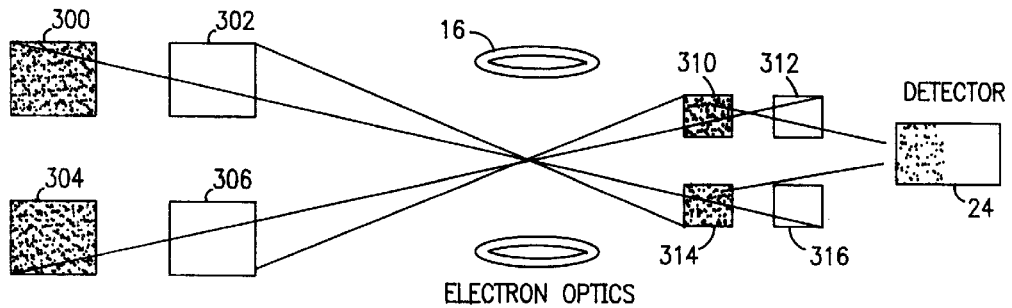
Figure 6D:
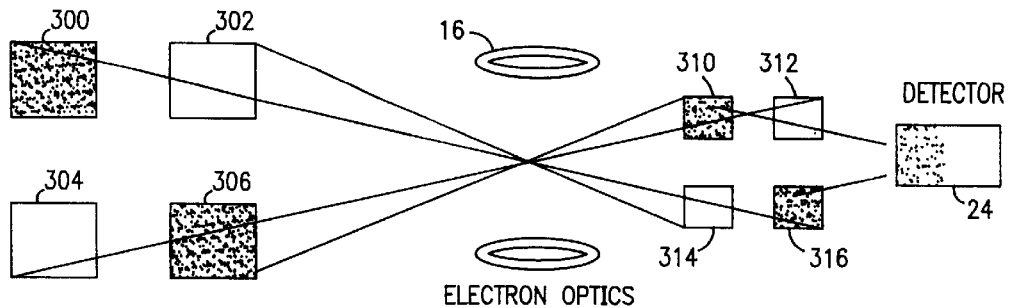

In the electron beam patterns of FIGS. 6A–6D, the electron current of each of the electron beams 300, 302, 304 and 306 may be controlled between a maximum current $L_0$ and zero current. In the following discussion, the beam currents are normalized to values in a range of 0 to 1.0. In FIG. 6A, electron beams 300, 302, 304 and 306 each have currents of 0.5. The detector 24 detects the sum of the responses of pixels 310, 312, 314 and 316 to the electron beams and produces a first detector signal. In FIG. 6B, electron beams 300 and 302 have currents of 1.0, and electron beams 304 and 306 have zero current. The detector 24 detects the responses of pixels 310 and 312 to electron beams 304 and 306 and produces a second detector signal. In FIG. 6C, electron beams 300 and 304 have currents of 1.0, and electron beams 302 and 306 have zero current. The detector 24 detects the responses of pixels 310 and 314 to electron beams 300 and 304 and produces a third detector signal. In FIG. 6D, electron beams 300 and 306 have currents of 1.0, and electron beams 302 and 304 have zero current. The detector 24 detects the responses of pixels 310 and 316 and produces a fourth detector signal. The first, second, third and fourth detector signals produced by detector 24 form a sequence of detector signals which are processed by processor 30 (FIG. 1) to generate a pixel value for each of the pixels 310, 312, 314 and 316, as described below. The pixel values constitute an image of the illuminated region of the specimen. It will be understood that multiple sets of pixels on the specimen may be illuminated with the sequence of electron beam patterns in a scanning process to produce an image of the specimen or a desired portion of the specimen.

The detector senses the responses of a number of pixels on the specimen to stimulating electron beams. The response of a pixel is defined as the ratio of the signal generated by the detector and contributed by that pixel to the electron beam current incident on the pixel. By determining these values, an image of the specimen or a portion of the specimen can be generated. If N pixels are to be illuminated and their responses determined, it is necessary to project N electron beam patterns onto the pixels in order to recover their individual responses.

The electron beam patterns utilized in the electron beam microscope of the present invention are characterized by a beam configuration and a sequence of beam patterns based on the beam configuration. The beam configuration is defined by the total number of electron beams that may be activated and the spatial relationship between the electron beams, as well as the individual beam current, size and shape. Each electron beam pattern in the sequence uses the beam configuration, with selected ones of the electron beams activated. The beam configuration shown in FIGS. 6A–6D is a 2×2 array of spaced-apart electron beams. The sequence of electron beam patterns includes four electron beam patterns in which selected ones of the beams in the 2×2 beam configuration are activated.

For the purposes of calculation, the currents used in the electron beam patterns can be written as a matrix I.

$$I = \begin{bmatrix} I_{11} & \cdots & I_{N1} \\ I_{21} & \cdots & I_{N2} \\ \vdots & & \vdots \\ I_{N1} & \cdots & I_{NN} \end{bmatrix} \quad (1)$$

where $I_{jk}$ represents the current illuminating the jth pixel when the kth pattern is being projected. The patterns of illumination, written as a vector $I_k=[I_{1k} \ldots I_{Nk}]$, can be chosen according to the following criteria. First, the electron beam patterns should, as a set, be linearly independent, meaning that any given electron beam pattern $I_k$ cannot be duplicated by any linear combination of the other N–1 electron beam patterns. This insures that the sequence of detector signals corresponding to a sequence of electron beam patterns does not contain redundant information and yet contains sufficient information to determine the pixel values. Secondly, the electron beam patterns should, as a general rule, be chosen so as to maximize the amount of current that can be delivered to the specimen for a given resolution. This implies minimizing space charge interactions, both within and between beams. Ultimately, the electron beam pattern should be selected to maximize the signal-to-noise ratio for each pixel, and thus to achieve maximum speed, while keeping the beam diameter smaller than or equal to the pixel size. The beams in the pattern should be spread out to avoid concentrating current on any pixel or group of pixels. This requirement must be balanced against off-axis aberrations in the gun and column. The best approach depends on the application, but the maximum current delivered to a pixel should be kept to a minimum, as should the total current delivered when projecting any pattern. As the total current plays a role in space charge defocusing and blurring, by keeping the total current constant from pattern to pattern, it may be possible to more closely control space charge defocusing and blurring. Referring again to FIGS. 6A–6D, it may observed that the total current in each of the patterns is the same.

The detector signal strengths for the kth pattern, $S_k$, written as a vector $s=[s_1 \ldots s_N]$, are determined by the responses of the pixels $r_j$, written as a vector $r=[r_1 \ldots r_N]$, by multiplying by the illumination matrix I.

$$s = I * r \quad (2)$$

It should be noted that for Equation (2) to be true, the detector and pixel responses must both be linear. If either response is nonlinear, Equation (2) must be modified to take this into account.

When the detector signal strengths $s=[s_1 \ldots s_N]$ have been measured, the responses of the pixels can be determined by inverting Equation (2).

$$r = I^{-1} * s \quad (3)$$

The value of $I^{-1}$ can be calculated or determined experimentally before measurement with a specimen of known response. Determining the responses of the pixels, from which the desired image is then reconstructed, thus requires only a single matrix multiplication. Matrix multiplication is a straightforward operation that can be performed by digital computers or analog electronics.

Referring again to the example of FIGS. 6A–6D, the illumination matrix I may be written as $$I = \begin{bmatrix} 0.5 & 0.5 & 0.5 & 0.5 \\ 1 & 1 & 0 & 0 \\ 1 & 0 & 1 & 0 \\ 1 & 0 & 1 & 0 \end{bmatrix} * I_0 \quad (4)$$

where $I_0$ is a current determined by the desired throughput and resolution. In this example, the inverse illumination matrix $I^{-1}$ is given by $$I^{-1} = \begin{bmatrix} 1.0 & 0.5 & 0.5 & 0.5 \\ 1.0 & 0.5 & -0.5 & -0.5 \\ 1.0 & -0.5 & 0.5 & -0.5 \\ 1.0 & -0.5 & -0.5 & 0.5 \end{bmatrix} * I_0^{-1} \quad (5)$$

and the responses of pixels 310, 312, 314 and 316, $r=[r_1\ r_2\ r_3\ r_4]$ are determined by simple multiplication by a vector constructed from the individual detector signals $s=[s_1\ s_2\ s_3\ s_4]$ $$\begin{bmatrix} r_1 \\ r_2 \\ r_3 \\ r_4 \end{bmatrix} = I^{-1} * \begin{bmatrix} s_1 \\ s_2 \\ s_3 \\ s_4 \end{bmatrix} \quad (6)$$

The electron beam patterns can then be deflected to another set of pixels and the process can be repeated to build up a complete image of the specimen or a desired portion of the specimen. In an alternative scanning approach described below, one beam pattern is scanned over the specimen or the desired portion of the specimen and the detector signals are recorded. Then the system switches to the next beam pattern in the sequence and the scan is repeated.

Figure 7:
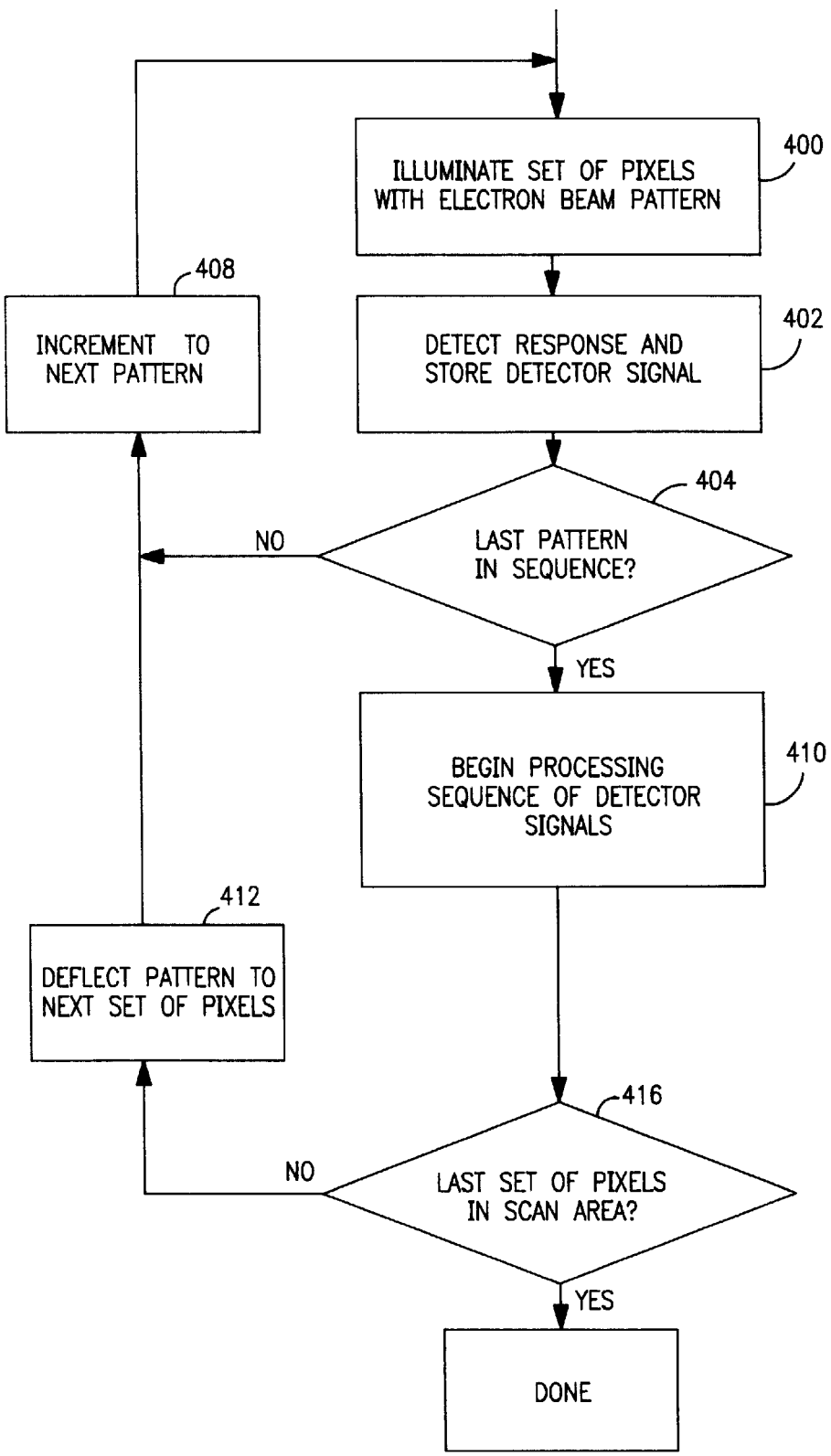
FIG. 7 is a flow chart that illustrates the operation of the electron beam microscope of the present invention using a first scanning technique.

A flow diagram of a process for obtaining an image of a specimen or a desired portion of a specimen with the electron beam microscope of the present invention is shown in FIG. 7. In step 400, a set of pixels on the specimen, identified as the current set of pixels, is illuminated with an electron beam pattern. The responses of the illuminated pixels to the electron beam pattern are detected, and the detector signal is stored in step 402. In step 404, a determination is made as to whether the current electron beam pattern is the last pattern in a sequence of electron beam patterns. When the current pattern is not the last pattern, the process increments to the next pattern in step 408, by changing the pattern control signals applied to the electron beam pattern source 10, and returns to step 400 for illumination of the current set of pixels on the specimen with the next electron beam pattern. When the sequence of electron beam patterns has been completed, as determined in step 404, processing of the sequence of detector signals may begin in step 410. The responses of the illuminated pixels are determined from the sequence of detector signals in accordance with Equation (3) above. Alternatively, the stored detector signals can be processed at a later time to generate an image of the specimen. In step 416, a determination is made as to whether the current set of pixels on the specimen is the last set of pixels to be probed. When the current set of pixels is not the last set of pixels, the electron beams of the electron beam pattern are deflected by deflector 18 to the next set of pixels on the specimen in step 412. The process then returns to steps 400 and 408 for illumination of the next set of pixels on the specimen with the sequence of electron beam patterns. When the current set of pixels is the last set of pixels, the process is complete.

The process may utilize a raster scan of the specimen or the desired portion of the specimen. The beam patterns are deflected along a stripe comprising one or more rows of pixels. The number of rows in the stripe depends on the configuration of the electron beam patterns. When the stripe is completed, the beam patterns are deflected perpendicular to the stripe and the next stripe is scanned. This operation is repeated until the desired area has been scanned.

The processor 30 (FIG. 1) may contain software for controlling the operation of the electron beam microscope as shown in the flow chart of FIG. 7 and described above. In particular, the processor 30 may generate pattern control signals for controlling electron beam pattern generator 10 and scan control signals for controlling deflector 18. In addition, the processor 30 stores and processes the detector signals from detector 24 and generates pixel values for producing an image of specimen 20 or a desired portion of specimen 20, as described above. The processor 30 may be any general purpose or special purpose computer, such as for example a personal computer (PC) or custom electronics, having circuitry for interfacing to the components of the electron beam microscope. Suitable interface circuitry is well known to those skilled in the art.

It will be understood that the electron beam pattern used for illumination of the specimen in accordance with the invention may include any practical number of two or more electron beams. In any particular electron beam pattern, each electron beam may be controlled at a current value between zero current and maximum beam current.

The present invention bas the advantage of spreading out the electron beam current traveling to the specimen, so that space charge interactions are minimized. Thus the current that can be delivered to the specimen for a given resolution is increased. Referring again to FIGS. 6A–6D, a total current of $2I_0$ is spread out over two or more electron beams. By comparison with a single beam of current $2I_0$ as used in prior art SEM's, the space charge interaction and defocusing are reduced.

In the example of FIGS. 6A–6D, electron beams 300, 302, 304 and 306 are spaced apart to reduce space charge interactions and defocusing. In this case, it is necessary to utilize interleaved electron beam patterns in order to obtain a complete image of the specimen. For example, the pattern is shifted by one pixel to the right in order to illuminate a pixel between pixels 300 and 302, and a pixel between pixels 304 and 306. Similarly, the pattern is shifted downward by one pixel in order to illuminate a pixel between pixels 300 and 304 and a pixel between pixels 302 and 306.

Using this approach, a complete and continuous image of the specimen or a desired portion of the specimen may be obtained. In an alternative approach, the electron beam pattern may have contiguous electron beams and thereby illuminate contiguous pixels on the specimen. This approach has the advantage of simplified scanning but exhibits increased space charge interaction as compared with the patterns illustrated in FIGS. 6A–6D.

The number of electron beams in the electron beam pattern is a tradeoff between increased complexity and reduced space charge interaction. As the number of beams is increased, the current delivered to the specimen is more spread out, and space charge interaction is reduced. However, the complexity of the system is increased, since more electron beams must be generated and controlled.

A second scanning technique is described with reference to FIGS. 8A, 8B, 9A, 9B and 10. Rather than probing each individual set of pixels, such as the four pixels in the 2×2 array example, with a sequence of electron beam patterns and then stepping to the next set of pixels, another approach is to form a first electron beam pattern and scan that beam pattern across the specimen, recording the responses of multiple sets of pixels on the specimen. The system then increments to a second electron beam pattern in the sequence and scans the second electron beam pattern across the same sets of pixels in a similar manner. This process is repeated through the whole sequence of electron beam patterns. In this way, a large number of pixels can be probed without requiring high speed switching of patterns. Also, the individual pixel responses are recovered with fewer (although more complex) calculations by manipulating the larger data sets thus obtained. These calculations are a straightforward extrapolation of the calculations described above.

In this second scanning technique, the selection of electron beam patterns may involve considerations in addition to those described above. It may be advantageous to continuously scan the beam patterns, in a manner similar to that used in a standard SEM, as this is a well-known, simple and fast technique. Another option is to move the beam patterns discontinuously in steps, temporarily inhibiting detection and/or blanking the beam and then moving to the next set of pixels. This approach can incur a loss of speed because it is necessary to wait for the beam to come to rest, due to the well-known phenomenon of the settling time of the deflectors and deflector drivers, before data can be obtained. With continuous movement, such delays are not incurred.

The second scanning approach generally involves moving the beam pattern along a first axis to probe a stripe of pixels, typically including two or more rows of pixels, and then moving along a second axis perpendicular to the first axis, so that another stripe parallel to the first is probed. For the continuous scanning approach to work most efficiently, it may be necessary to ensure that the beam pattern does not include more than one pixel in a row so that a given pixel is not probed more than once during the scan by any one beam pattern. It may also be advantageous to arrange the beams in the beam pattern such that all adjacent rows of a stripe are probed in one sweep of the beam.

Figure 8A:
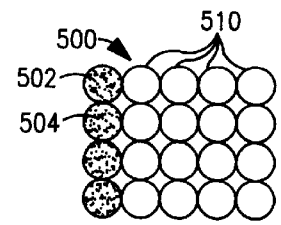
FIGS. 8A, 8B, 9A and 9B illustrate different electron beam patterns that may be use in the electron beam microscope of the present invention.
Figure 8B:
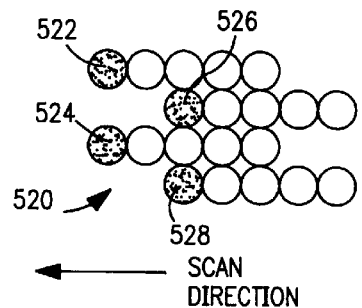

The simplest example of a pattern satisfying these requirements is a column of pixels, one for each row. A four beam configuration 500 is illustrated in FIG. 8A, wherein the four shaded dots 502, 504, etc. represent beams that may be on or off, depending upon the beam pattern being projected. The four beams are close together so as to probe adjacent rows. Previously probed pixels in the scan are indicated by open dots 510. Thus, the beams cover a solid stripe across the specimen when scanned. This approach may be extended to include beams in staggered columns such that the electron beams are spread over a larger area. As shown in FIG. 8B, a beam configuration 520 includes four beams in adjacent rows, with two beams 522 and 524 in a first column of pixels and two beams 526 and 528 in a second column. The second column is separated from the first column by one column. The configuration of FIG. 8B may improve the performance of the electron optics, which depends on the distance of the beam from the optical axis. Staggering the beams increases the distance between beams, thus reducing space charge interaction, while increasing the maximum distance of any beam from the center of the pattern only slightly. The beams may be staggered among two or more columns of pixels and may or may not be in adjacent columns. In the beam configuration 520 of FIG. 8B, beams 522, 524, 526 and 528 are separated from each other by at least one beam diameter. Each of the beams 522, 524, 526 and 528 may be on or off in a particular beam pattern.

Figure 9A:
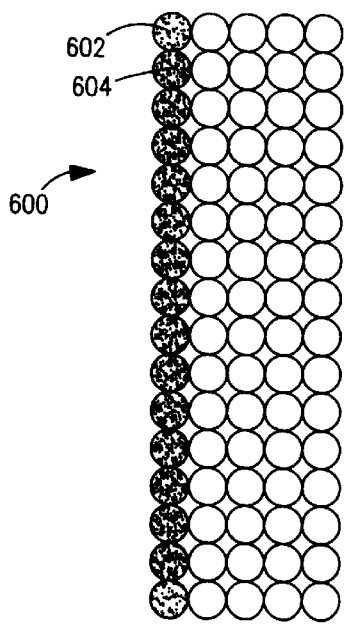
Figure 9B:
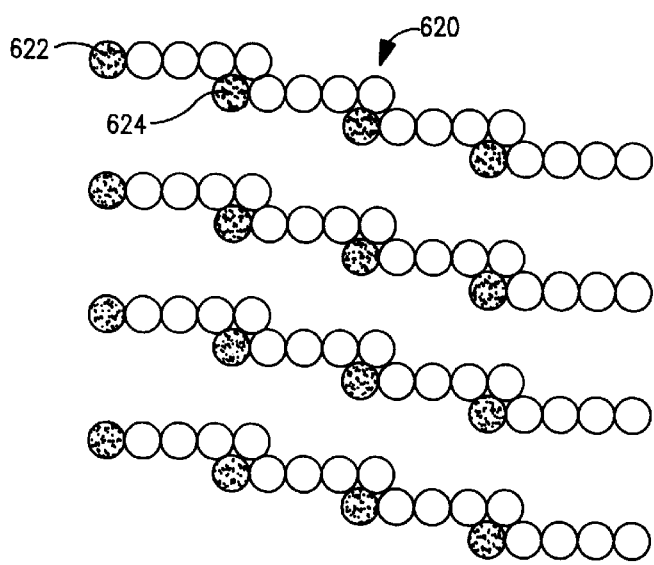

FIGS. 9A and 9B illustrate an extension of this approach to a beam configuration including 16 beams. In FIG. 9A, a beam configuration 600 includes 16 beams 602, 604, etc. in a single column. In FIG. 9B, a beam configuration 620 includes 16 beams 622, 624, etc. staggered in four spaced-apart columns of pixels. In each of the configurations 600 and 620, the beams probe 16 adjacent rows of pixels. In each of the configurations 600 and 620, each individual beam may be on or off in a particular beam pattern. It will be understood that a variety of beam configurations may be used in the second scanning technique and that the optimum configuration depends on the application.

Figure 10:
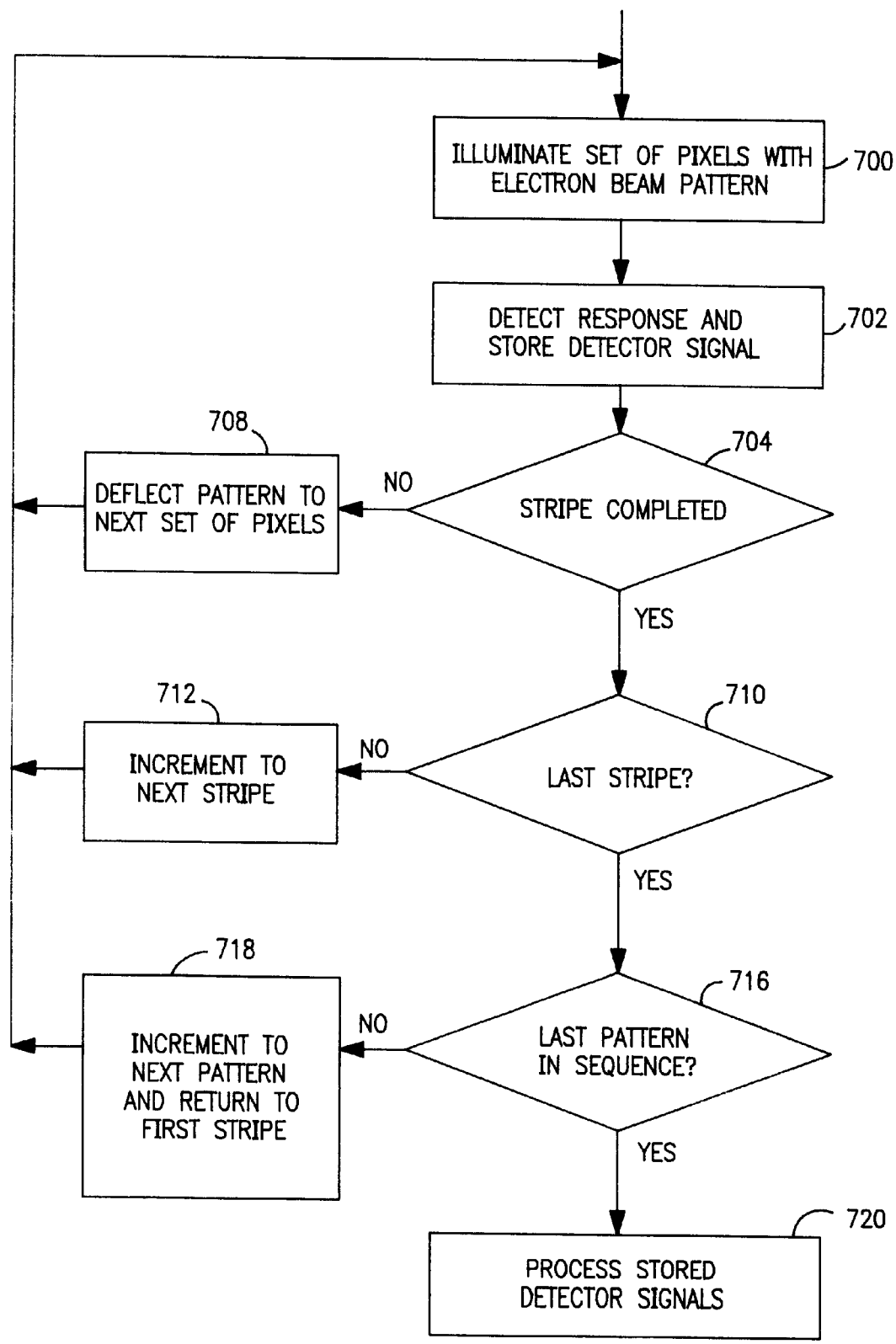
FIG. 10 is a flow chart that illustrates the operation of the electron beam microscope of the present invention using a second scanning technique.

A flow diagram of a process for obtaining an image of a specimen or a desired portion of a specimen with the electron beam microscope of the present invention using the second scanning technique is shown in FIG. 10. In step 700, a set of pixels in a selected stripe of the specimen, identified as the current stripe, is illuminated with an electron beam pattern. The responses of the illuminated pixels to the electron beam pattern are detected, and the detector signal is stored in step 702. In step 704, a determination is made as to whether the current set of pixels is the last set of pixels in the current stripe, i.e., whether the stripe has been fully scanned. When the stripe is not completed, the process deflects the electron beam pattern to the next set of pixels in the stripe in step 708 and returns to step 700 for illumination of the next set of pixels with the current beam pattern. As indicated above, deflection of the electron beam pattern along a stripe may be continuous or in steps. When the stripe has been completed, as determined in step 704, a determination is made in step 710 as to whether the current stripe is the last stripe being probed. When the current stripe is not the last stripe, the process increments to the next stripe in step 712 and returns to step 700 for illumination of the next stripe with the current beam pattern. When the current stripe is the last stripe, as determined in step 710, a scan of the specimen or desired portion of the specimen has been completed. A determination is then made in step 716 as to whether the current beam pattern is the last pattern in the sequence of beam patterns. When the current beam pattern is not the last pattern, the process increments to the next beam pattern in the sequence and returns to the first stripe in the region being probed in step 718. The process then returns to step 700 for illumination of the first set of pixels in the first stripe with the new beam pattern. The new beam pattern is then used to scan the specimen in the same manner. When the current pattern is the last pattern in the sequence, as determined in step 716, scanning is complete and the stored detector signals may be processed in step 720. It will be understood that the stored detector signals may be processed immediately upon completion of scanning or at a later time.

In summary, the electron beam microscope of the present invention typically utilizes raster scanning of the electron beam patterns. In one approach, the sequence of electron beam patterns is applied to each set of pixels before moving to the next set of pixels. In another approach, each electron beam pattern is scanned over the specimen or the desired portion of the specimen before switching to the next beam pattern in the sequence. The scanning may be interleaved or non-interleaved.

While there have been shown and described what are at present considered the preferred embodiments of the present invention, it will be obvious to those skilled in the art that various changes and modifications may be made therein without departing from the scope of the invention as defined by the appended claims.

What is claimed is:

1. An electron beam microscope comprising:
    a source for generating a sequence of patterns of electron beams for illuminating pixels on a specimen, each of said patterns comprising multiple beams of electrons;
    a vacuum enclosure for maintaining a vacuum between said source and the specimen;
    electron optics located within said vacuum enclosure for directing said patterns of electron beams to the specimen;
    a detector for simultaneously detecting a result of an interaction between more than one of said beams of said pattern of electron beams and said specimen to produce detector signals corresponding to said sequence of patterns generated by said source; and
    a processor responsive to said sequence of detector signals for generating an image comprising a pixel value representative of each of the illuminated pixels on the specimen.

2. An electron beam microscope as defined in claim 1 further comprising a deflector located within said vacuum enclosure for deflecting said electron beams relative to the specimen, wherein multiple sets of pixels on the specimen are illuminated with said sequence of electron beams, said detector produces said sequence of detector signals for each of said sets of pixels and said processor generates an image of the illuminated sets of pixels on the specimen.

3. An electron beam microscope as defined in claim 2 wherein said processor includes means for controlling said source and said deflector for illuminating the specimen or a desired portion of the specimen with a first pattern of electron beams, followed by switching to a second pattern of electron beams and illuminating the specimen or the desired portion of the specimen with said second pattern of electron beams.

4. An electron beam microscope as defined in claim 2 wherein said processor includes means for controlling said source and said deflector for illuminating a first set of pixels with said sequence of electron beams, followed by deflecting said electron beams to a second set of pixels and illuminating said second set of pixels with said sequence of electron beams.

5. An electron beam microscope as defined in claim 1 wherein said source comprises:
    a negative electron affinity photocathode on a light-transmissive substrate, said photocathode having a conduction band and a plurality of active areas for emission of electrons;
    a light source for directing light beams through said light-transmissive substrate at the active areas of said photocathode for exciting electrons into the conduction band of said photocathode;
    electron optics for forming the electrons emitted from the active areas of said photocathode into electron beams; and
    a source vacuum enclosure for maintaining said photocathode at high vacuum such that electrons in the conduction band of said photocathode have higher energies than electrons in the source vacuum enclosure adjacent to said photocathode and have a high probability of emission into the source vacuum enclosure from the active areas of said photocathode.

6. An electron beam microscope as defined in claim 5 wherein light beams comprise laser beams.

7. An electron beam microscope as defined in claim 5 wherein said light source comprises a plurality of individually-controllable laser diodes.

8. An electron beam microscope as defined in claim 5 wherein said light source includes modulators for controlling each of said light beams.

9. An electron beam microscope as defined in claim 1 wherein said processor includes means for generating a pixel value representative of each of said plurality of illuminated pixels by multiplying a matrix containing said sequence of detector signals by an inverse of an illumination matrix representative of said sequence of said patterns of election beams.

10. An electron beam microscope as defined in claim 1 wherein each of said electron beam patterns is linearly independent of the others of said electron beam patterns.

11. An electron beam microscope as defined in claim 1 wherein a total electron beam current is constant in each of said patterns of electron beams.

12. An electron beam microscope as defined in claim 1 wherein the parallel electron beams are spaced apart and illuminate spaced-apart pixels on the specimen.

13. A method for obtaining an image of a specimen, comprising the steps of:
    a) generating a plurality of electron beams from an electron source in a predefined special pattern;
    b) illuminating a set of areas on a specimen with said special pattern, such that each individual beam of said pattern simultaneously interacts with a unique area of said set;
    c) detecting the result of the interactions between said electron beams and said areas as a single signal and storing the result; and
    d) repeating steps a) through c) while systematically varying the special pattern of the illuminating beams and areas illuminated on the specimen until enough information is accumulated to reconstruct an image of at least a portion of said specimen.

14. A method as defined in claim 13 further including the step of deflecting each of said electron beams, wherein a second set of areas on the specimen is illuminated with said sequence of electron beams.

15. A method as defined in claim 13 further including the steps of illuminating the specimen or a desired portion of the specimen with a first set of electron beams of said sequence, followed by switching to a second set of electron beams of said sequence and illuminating the specimen or the desired portion of the specimen with said second set of electron beams.

16. A method as defined in claim 13 further including the steps of illuminating a first set of areas of said specimen with a first sequence of electron beams, followed by deflecting said electron beams to a second set of areas of said specimen and illuminating said second set of areas of said specimen with said second sequence of electron beams.

17. A method as defined in claim 13 such that each of said electron beams is linearly independent of the others of said electron beams.

18. A method as defined in claim 13 further including the step of selecting special patterns such that a total electron beam current is constant in each of said patterns.

19. A method as defined in claim 13 including the step of generating an image comprising an area value representative of each illuminated area of the specimen in response to said sequence of detector signals.

20. An electron beam microscope comprising:

an electron beam pattern source for generating a sequence of patterns of electron beams for illuminating a set of areas on a specimen;

a vacuum enclosure for maintaining a vacuum between said electron beam pattern source and the specimen;

electron optics located within said vacuum enclosure for directing said sequence of electron beam patterns to the specimen;

a deflector located within said vacuum enclosure for deflecting each of said sequence of patterns of electron beams relative to the specimen, wherein multiple sets of areas on the specimen are illuminated with said sequence of patterns of electron beams;

a detector for detecting a result of an interaction between each of said electron beams and areas of said specimen on illumination of said specimen with a sequence of patterns of electron beams and producing a single detector measurement for each of said patterns; and a processor responsive to the sequence of detector measurements for each of said sets of areas for generating an image of said areas on the specimen, said image comprising an area value representative of said specimen.

21. An electron beam microscope as defined in claim 20 wherein said processor includes means for controlling said electron beam pattern source and said deflector for scanning the specimen or a desired portion of the specimen with a first electron beam pattern of said sequence, followed by switching to a second electron beam pattern of said sequence and scanning the specimen or the desired portion of the specimen with said second electron beam pattern.

22. An electron beam microscope as defined in claim 20 wherein said electron beam pattern source comprises:

a negative electron affinity photocathode on a light-transmissive substrate, said photocathode having a conduction band and a plurality of active areas for emission of electrons;

a light source for directing light beams through said light-transmissive substrate at the active areas of said photocathode for exciting electrons into the conduction band of said photocathode;

electron optics for forming the electrons emitted from the active areas of said photocathode into electron beams; and a source vacuum enclosure for maintaining said photocathode at high vacuum such that electrons in the conduction band of said photocathode have higher energies than electrons in the source vacuum enclosure adjacent to said photocathode and have a high probability of emission into the source vacuum enclosure from the active areas of said photocathode.

23. An electron beam microscope as defined in claim 20 wherein said detector comprises an electron detector for detecting secondary electrons and backscattered primary electrons.

24. An electron beam microscope as defined in claim 20 wherein said processor includes means for generating an area value representative of of said illuminated areas by multiplying a matrix containing said sequence of detector signals by an inverse of an illumination matrix representative of said sequence of said patterns of electron beams.

25. An electron beam microscope as defined in claim 20 wherein each of said electron beam patterns is linearly independent of the others of said electron beam patterns.

26. An electron beam microscope as defined in claim 20 wherein a total electron beam current is constant in each of said electron beam patterns.

27. A method for obtaining an image of a specimen, comprising the steps of:

a) generating a pattern of electron beams;

b) directing said pattern to a specimen;

c) illuminating a set of pixels on said specimen with said pattern;

d) detecting a result of an interaction between said electron beam pattern and the specimen and producing a single detector measurement;

e) deflecting said pattern to another set of pixels of said specimen;

f) repeating steps c), d) and e) until all the sets of pixels in the specimen to be imaged have been probed;

g) repeat steps a) through f) with additional patterns of electron beams until sufficient information to construct an image has been obtained; and h) generating an image comprising a pixel value representative of each of the illuminated pixels on the specimen in response to said detector measurements.

28. A method for obtaining an image of a specimen, comprising the steps of:

a) illuminating a set of pixels on a specimen with a sequence of electron beam patterns;

b) detecting a result of an interaction between each of said electron beam patterns and the specimen producing a sequence of separate detector measurement corresponding to said sequence of electron beam patterns and the set of illuminated pixels;

c) deflecting said electron beam patterns to multiple sets of pixels on the specimen and repeating steps a) and b) for each of said sets of pixels illuminated; and d) generating an image comprising a pixel value representative of each of the illuminated pixels on the specimen in response from said detector measurements.

* * * * *

UNITED STATES PATENT AND TRADEMARK OFFICE
CERTIFICATE OF CORRECTION

PATENT NO : 6,005,247
DATED : December 21, 1999
INVENTOR(S): Aaron W. Baum

It is certified that error appears in the above-identified patent and that said Letters Patent are hereby corrected as shown below:

Column 14, lines 42, 44 and 51 and Column 15, line 9,
    change at each occurrence, the word "special" to
    -- spatial --.

Signed and Sealed this

Twenty-fourth Day of April, 2001

Attest:

NICHOLAS P. GODICI

Attesting Officer     Acting Director of the United States Patent and Trademark Office